United States Patent
Kawakami et al.

(10) Patent No.: US 10,039,066 B2
(45) Date of Patent: Jul. 31, 2018

(54) AUTOMATIC GAIN CONTROL METHOD AND AUTOMATIC GAIN CONTROL CIRCUIT

(71) Applicant: NEC Space Technologies, Ltd., Fuchu-shi, Tokyo (JP)

(72) Inventors: Satoko Kawakami, Tokyo (JP); Susumu Kumagai, Tokyo (JP)

(73) Assignee: NEC SPACE TECHNOLOGIES, LTD., Tokyo (JP)

( * ) Notice: Subject to any disclaimer, the term of this patent is extended or adjusted under 35 U.S.C. 154(b) by 0 days.

(21) Appl. No.: 15/503,073

(22) PCT Filed: Aug. 19, 2015

(86) PCT No.: PCT/JP2015/004141
§ 371 (c)(1),
(2) Date: Feb. 10, 2017

(87) PCT Pub. No.: WO2016/031184
PCT Pub. Date: Mar. 3, 2016

(65) Prior Publication Data
US 2017/0230921 A1  Aug. 10, 2017

(30) Foreign Application Priority Data
Aug. 25, 2014  (JP) ................. 2014-170187

(51) Int. Cl.
*H04W 52/52* (2009.01)
*H03G 3/30* (2006.01)
(Continued)

(52) U.S. Cl.
CPC .......... *H04W 52/52* (2013.01); *H03G 3/3036* (2013.01); *H04B 1/10* (2013.01); *H04B 7/2628* (2013.01); *H04B 17/318* (2015.01)

(58) Field of Classification Search
CPC ....... H04W 52/52; H04B 17/318; H04B 1/10; H04B 7/2628; H03G 3/3036
See application file for complete search history.

(56) References Cited

U.S. PATENT DOCUMENTS 5,630,220 A    5/1997  Yano
2003/0232608 A1  12/2003  Yamauchi
(Continued)

FOREIGN PATENT DOCUMENTS

JP    H05-080053 U    10/1993
JP    H05-327378 A    12/1993
(Continued)

OTHER PUBLICATIONS

International Search Report for PCT Application No. PCT/JP2015/004141, dated Nov. 10, 2015.
(Continued)

*Primary Examiner* — Janice Tieu (57) ABSTRACT

This automatic gain control circuit is provided with a variable gain amplifier for amplifying a received signal, has a small circuit size, and makes it possible to reduce the effect of superimposed external noise input within the frequency bandwidth of a received signal. The automatic gain control circuit supplies the output of the variable gain amplifier to an analog/digital converter and comprises: a frequency selection circuit that is connected to the output of the analog/digital converter and that selects a signal within the frequency bandwidth of a received signal, said signal having a narrower bandwidth than the frequency bandwidth; and a control signal generation circuit that generates a control signal for the variable gain amplifier on the basis of the strength of the signal selected by the frequency selection circuit.

8 Claims, 7 Drawing Sheets

(51) Int. Cl.
   *H04B 17/318* (2015.01)
   *H04B 7/26* (2006.01)
   *H04B 1/10* (2006.01)

(56) References Cited

U.S. PATENT DOCUMENTS

| | | |
|---|---|---|
| 2004/0017866 A1* | 1/2004 | Fujishima ............ H03G 3/3068 375/345 |
| 2006/0084402 A1 | 4/2006 | Oshima et al. |
| 2006/0109939 A1 | 5/2006 | Ciccarelli et al. |
| 2009/0023404 A1 | 1/2009 | Leinonen et al. |
| 2009/0061806 A1 | 3/2009 | Saito et al. |
| 2012/0314824 A1 | 12/2012 | Fujimura |

FOREIGN PATENT DOCUMENTS

| | | |
|---|---|---|
| JP | H09-294091 A | 11/1997 |
| JP | H10-322150 A | 12/1998 |
| JP | H11-195941 A | 7/1999 |
| JP | 2004-023508 A | 1/2004 |
| JP | 2006-121146 A | 5/2006 |
| JP | 2012-044456 A | 3/2012 |
| WO | 2013/008747 A1 | 1/2013 |

OTHER PUBLICATIONS

English translation of Written opinion for PCT Application No. PCT/JP2015/004141.
Japanese Office Action for JP Application No. 2016-544938 dated May 8, 2018 with English Translation.
Extended European Search Report for EP Application No. EP15835327.6 dated Mar. 8, 2018.

* cited by examiner

PRIOR ART

Fig.7

PRIOR ART

AUTOMATIC GAIN CONTROL METHOD AND AUTOMATIC GAIN CONTROL CIRCUIT

This application is a National Stage Entry of PCT/JP2015/004141 filed on Aug. 19, 2015, which claims priority from Japanese Patent Application 2014-170187 filed on Aug. 25, 2014, the contents of all of which are incorporated herein by reference, in their entirety.

TECHNICAL FIELD

The present invention relates to an automatic gain control method and an automatic gain control circuit used in wireless communication devices and the like.

BACKGROUND ART

In a wireless communication device, especially a receiver, the fluctuation range of strength of a received signal input through an antenna is large. If a device is configured to receive a small signal, it will cause such detrimental effects as distortion by receiving an excessive signal. In view of this, an AGC (automatic gain control) circuit has been used that supplies, to a later-stage circuit, an input signal of which the strength fluctuation is restrained by controlling the gain in signal amplification based on the fluctuation of the signal strength.

Figure 6:
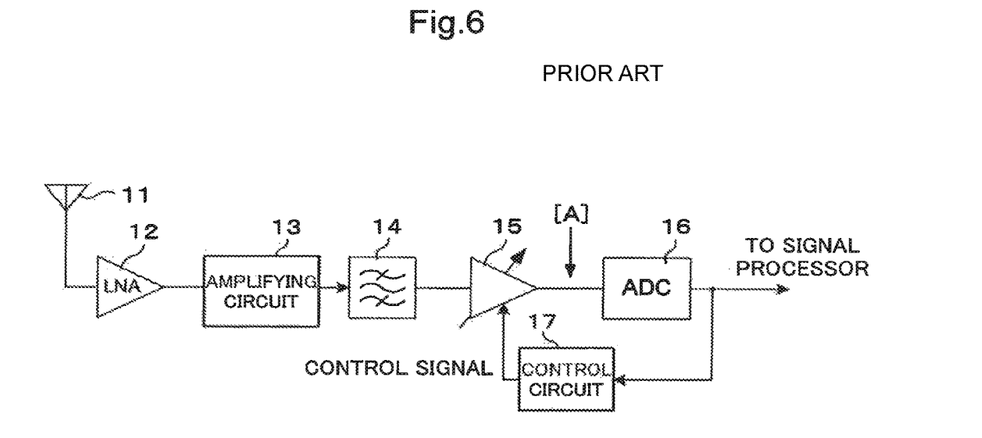
FIG. 6 is a circuitry diagram illustrating a configuration of a general RF front-end.

FIG. 6 illustrates a configuration of a general RF (radio frequency) front-end provided in a receiver in the related art. This RF front-end amplifies a signal received at the antenna 11 and converts the signal into a digital signal, and includes an automatic gain controlling function. The antenna 11 is connected to an LNA (low noise amplifier) 12 that amplifies a received signal. The output of the LNA 12 is supplied via an amplifying circuit 13, to a BPF (band-pass filter) 14, which causes only a signal of a desired frequency bandwidth to pass. The signal of a desired frequency, having passed through the BPF 14 is next amplified by the variable gain amplifier 15, and is converted by an ADC (analog-to-digital convertor) 16 into a digital signal. The digital signal obtained by the conversion is supplied to a digital signal processor of this receiver, for example. The variable gain amplifier 15 is an amplifier that changes the gain according to a control signal, and the control signal is a voltage signal, for example. A control circuit 17 is provided to generate a control signal. The control circuit 17 refers to the signal strength detected by the ADC 16, and when the signal strength is large, decreases the gain of the variable gain amplifier 15 to generate a control signal so as to make the signal level input to the ADC 16 to be constant, and supplies the control signal to the variable gain amplifier 15. In the configuration illustrated in FIG. 6, the variable gain amplifier 15 and the control circuit 17 constitute the automatic gain control circuit. When the strength of the signal detected at the output side of the variable gain amplifier 15 is equal to or smaller than a threshold value, the gain is not restricted in the variable gain amplifier 15 in the automatic gain control circuit. In general, in the automatic gain control circuit, the variable gain amplifier operates at its maximum gain, if the strength of the signal detected at the output side of the variable gain amplifier 15 is equal to or smaller than a threshold value.

Figure 7:
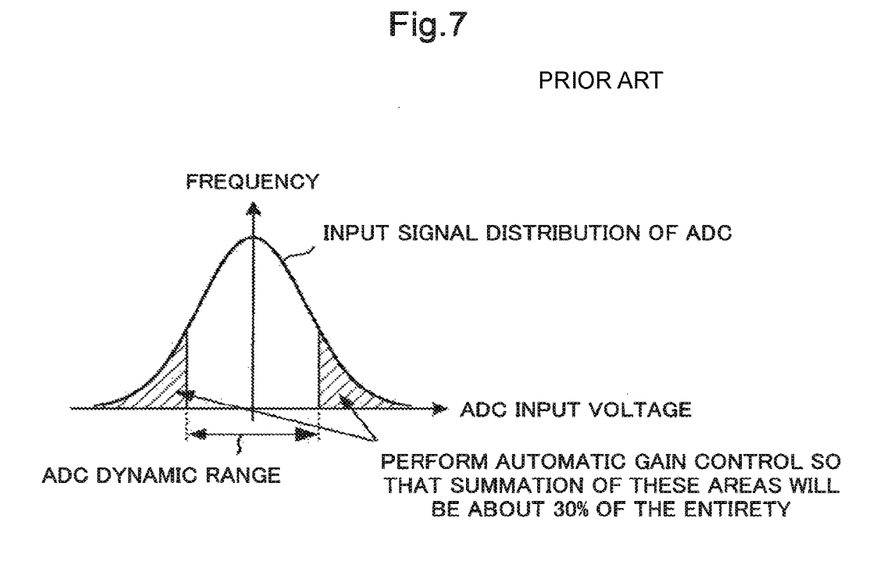
FIG. 7 is a diagram for explaining a level setting in automatic gain control.

In the RF front-end illustrated in FIG. 6, when the received signal is wideband and small due to spread spectrum modulation, the thermal noise of the LNA 12 is dominant in the input signal to the variable gain amplifier 15. Consequently, when the input signal to the ADC 16 obtained by amplifying such an input voltage in the variable gain amplifier 15 is represented in the frequency distribution of a signal voltage obtained by integrating a signal, the distribution is approximate to a normal distribution as illustrated in FIG. 7. Moreover, an ADC 16 that has a smaller number of bits such as two bits is used in such a case. When using an ADC of two bits or more, arrangement is made to allow a signal saturating the ADC to be input to the ADC 16. The saturation of the ADC means that an input signal exceeding the dynamic range of the ADC is input to the ADC.

In the RF front-end illustrated in FIG. 6, when the received signal is obtained by direct spread spectrum modulation, the threshold value of the automatic gain control is set so that about 30% of the entirety falls outside the dynamic range of the ADC 16, in the input signal distribution represented as a normal distribution. An example of the signal obtained by direct spread spectrum modulation and is received as a small signal includes a GPS (Global Positioning System) signal received from a GPS satellite.

In some occasions, a disturbance having a sharp frequency spectrum is input, by being superimposed on a wideband but small received signal. When there is no disturbance superimposed on the received signal, as a result of performing the automatic gain control, the signal represented by the dot [A] in FIG. 6, i.e., the input signal to the ADC 16 contains a sufficient level of received signal, which is a desired signal. As described above, the thermal noise of the LNA 12 is dominant in the input signal to the variable gain amplifier 15. Here, however, the received signal is a spread-spectrum modulated signal. Therefore, if the level of the received signal is equal to or greater than a certain ratio to the noise power, a desired result can be obtained by subjecting the digital signal output from the ADC 16 to digital signal processing.

On the contrary, if a disturbance having a narrow spectrum is superimposed to the received signal having the wideband, a disturbance input having a peak form is superimposed on the input signal distribution of the variable gain amplifier 15. This disturbance input superimposition will increase the total power of the input signal. Therefore, the automatic gain control decreases the gain of the variable gain amplifier 15, which decreases the reception level of the desired signal bandwidth in the input signal distribution of the ADC 16, thereby deteriorating the received signal. As a result, the disturbance input will have a detrimental effect to the function and performance of the receiver having this RF front-end.

PTL 1 discloses a method for preventing the influence due to the input of the disturbance superimposed on a wideband and small received signal. PTL 1 discloses preventing the interfering waves from saturating the ADC provided to the later-stage of the variable gain amplifier. PTL 1 discloses providing a variable frequency bandwidth restriction filter that functions as a notch filter before the variable gain amplifier, detecting the frequency of the interfering waves, and removing the frequency component of the interfering waves using the filter.

PTL 2 discloses a technique of reducing the effect of the interfering waves from the channel adjacent to the desired waves in the related art. PTL 2 discloses providing an analog band-pass filter of a narrow bandwidth to which an output signal from the variable gain amplifier is supplied, setting this filter so that the frequency of the interfering waves falls outside the pass band, and performing automatic gain control based on the output of the filter. PTL 3 discloses providing a variable band-pass digital filter synchronized with the desired waves later than the ADC, supplying the output of the variable gain amplifier to the ADC, converting the output into a digital signal, and controlling the gain of the variable gain amplifier based on the amplitude of this digital signal. In addition, PTL 3 discloses controlling the bandpass characteristic of the variable band-pass digital filter, and reducing the effect of the interfering waves. PTL 4 discloses obtaining the power of the desired waves and the power of the interfering waves by means of filter processing of the signals after quadrature detection, and performing automatic gain control by means of the variable gain amplifier by only following the power of the desired waves.

CITATION LIST

Patent Literature

[PTL 1]
Japanese Utility Model Application Laid-Open Publication H5-80053
[PTL 2]
Japanese Patent Application Laid-Open Publication H5-327378
[PTL 3]
Japanese Patent Application Laid-Open Publication 2006-121146
[PTL 4]
Japanese Patent Application Laid-Open Publication H11-195941

SUMMARY OF INVENTION

Technical Problem

As a method for reducing the effect of the disturbance input when the disturbance input is superimposed on the wideband and small received signal, the method disclosed in PTL 1 uses a variable frequency bandwidth restriction filter that functions as a notch filter, by being provided before the variable gain amplifier. However, this filter has such a problem that it is an analog filter and therefore it is difficult to accurately control this filter so as to obtain a desired filter characteristic, and that the circuit size becomes large.

An object of the present invention is to provide an automatic gain control method that uses a variable gain amplifier that amplifies a received signal, the automatic gain control method being able to reduce the circuit size, and being able to reduce the effect of the disturbance input superimposed within the frequency bandwidth of the received signal being the desired signal.

Another object of the present invention is to provide an automatic gain control circuit that includes a variable gain amplifier that amplifies a received signal, the automatic gain control circuit having a reduced circuit size, and being able to reduce the effect of the disturbance input superimposed within the frequency bandwidth of the received signal being the desired signal.

Solution to Problem

According to an exemplary embodiment, an automatic gain control method used in a receiver that includes: a variable gain amplifier to which a received signal is input; and an analog-to-digital convertor connected to an output of the variable gain amplifier, comprises: selecting a frequency of which a signal level output by the analog-to-digital convertor is smaller than other frequencies in a plurality of frequencies in a frequency bandwidth of the received signal; and determining a gain for the variable gain amplifier based on a signal strength of a component of the selected frequency in the output of the analog-to-digital convertor.

According to another exemplary embodiment, an automatic gain control method used in a receiver that includes: a variable gain amplifier to which a received signal is input; and an analog-to-digital convertor connected to an output of the variable gain amplifier, comprises: selecting a frequency bandwidth deviated from a frequency of a disturbance input superimposed on the received signal, from among the frequency bandwidths of the received signal; and determining a gain for the variable gain amplifier based on a signal strength of a component of the selected frequency bandwidth in the output of the analog-to-digital convertor.

According to still another exemplary embodiment, an automatic gain control circuit including a variable gain amplifier to which a received signal is input and supplying an output of the variable gain amplifier to an analog-to-digital convertor, comprises: a frequency selection circuit that is connected to the output of the analog-to-digital convertor and selects a signal of a bandwidth narrower than the frequency bandwidth, within the frequency bandwidth of the received signal; and a control signal generation circuit that generates a control signal for the variable gain amplifier based on a strength of a signal selected by the frequency selection circuit.

Advantageous Effect of Invention

The present invention selects a frequency free from the effect of the disturbance input, from among the frequency bandwidth of the received signal, and can perform automatic gain control based on the signal strength of the component of the selected frequency. Consequently, the effect of the disturbance input superimposed within the frequency bandwidth of the received signal can be reduced, thereby making it possible to perform signal processing to the received signal at a high signal level.

DESCRIPTION OF EMBODIMENTS

Next, the embodiments to exercise the present invention are explained with reference to the drawings.

Figure 1:
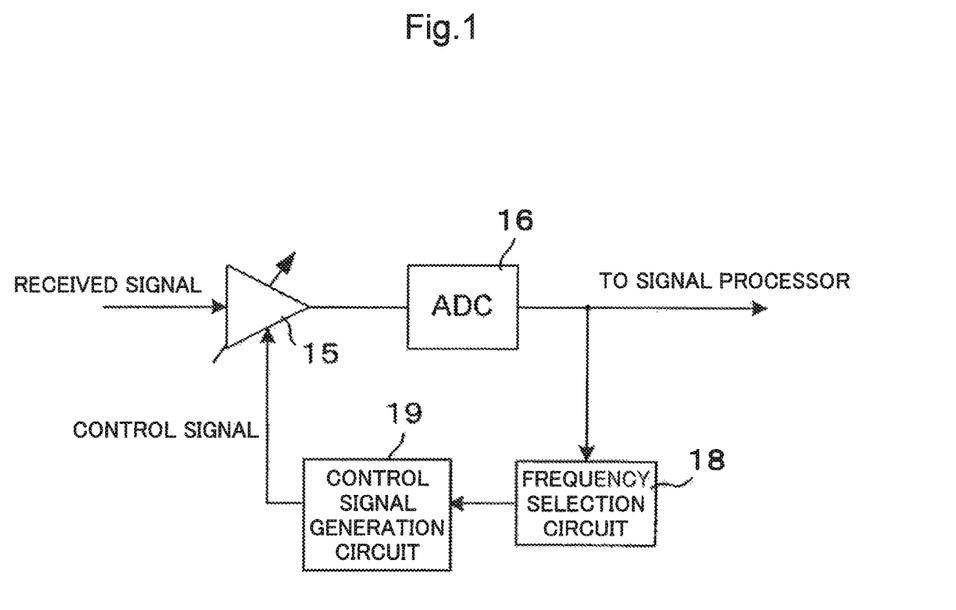
FIG. 1 is a block diagram illustrating an automatic gain control circuit according a basic exemplary embodiment of the present invention.

FIG. 1 illustrates an automatic gain control circuit according a basic exemplary embodiment. This automatic gain control circuit is preferably used in a receiver or the like that amplifies a received signal being an analog signal and thereafter converts the signal into a digital signal by means of an ADC (analog-to-digital convertor). As an example, the received signal being a desired signal is a spread-spectrum modulated wideband signal, and has a frequency bandwidth, for example, the width of which is several MHz.

The automatic gain control circuit includes a variable gain amplifier 15 that receives a received signal and amplifies the signal. The output of the variable gain amplifier 15 is supplied to the ADC 16 that converts the received signal into a digital signal. The digital signal output from the ADC 16 is supplied to, for example, a signal processor or the like provided in the receiver. The gain at the variable gain amplifier 15 is controlled by a control signal. This automatic gain control circuit generates a control signal according to the output of the ADC 16, and performs automatic gain control. To perform this, the automatic gain control circuit includes a frequency selection circuit 18 that is connected to the output of the ADC 16 and that selects a signal of a bandwidth narrower than this frequency bandwidth, within the frequency bandwidth of the received signal. In addition, the automatic gain control circuit includes a control signal generation circuit 19 that generates a control signal for the variable gain amplifier 15, based on the strength of the signal selected by the frequency selection circuit 18.

The frequency selection circuit 18 selects a frequency of which the signal level output by the ADC 16 is smaller than the other frequencies in the plurality of frequencies in the frequency bandwidth of the received signal. When a disturbance having a spectrum sharper than the frequency bandwidth of the received signal is superimposed on the frequency bandwidth of the received signal, the frequency selection circuit 18 takes out, from the output of the ADC 16, the component of the frequency range free from the effect of this disturbance. This is for performing automatic gain control by generating a control signal for the variable gain amplifier 15 based on the signal strength at the taken out component. Therefore, as the frequency selection circuit 18, those that can select a frequency bandwidth that is deviated from the frequency of the disturbance input superimposed on the received signal, from the frequency bandwidth of the received signal, can be used. As described later, for example, a digital filter may be used as the frequency selection circuit 18. The digital filter has a pass band narrower than the frequency bandwidth of the received signal. When it comes to the level for each frequency in a digital signal output by the ADC 16, the pass band of the digital filter is set to a frequency, the level of which at the output of the ADC 16 is relatively low. Alternatively, the pass band of the digital filter is set to a bandwidth that is deviated from the frequency of the disturbance input from the frequency bandwidth of the received signal.

If using such a frequency selection circuit 18, there is no effect of the disturbance input on the frequency selected by the frequency selection circuit 18. As a result, the control signal generation circuit 19 generates a control signal for the variable gain amplifier 16 based on the received signal and the noise component not dependent on a frequency such as the thermal noise, without depending on the magnitude of the disturbance. Here, "not dependent on a frequency" means not substantially depending on a frequency within the range of the frequency bandwidth of the received signal. In the circuit according to the present exemplary embodiment, the automatic gain control does not reflect the magnitude of the disturbance. Therefore, compared to the case of performing automatic gain control by reflecting the magnitude of the disturbance, the gain of the variable gain amplifier 15 will be larger, and as a result, the ADC 16 is easily saturated. If the received signal is assumed to be spread-spectrum modulated, for example, the ADC 16 will be used by allowing saturation as described above. Therefore, even if the automatic gain control does not reflect the magnitude of the disturbance when superimposing the disturbance on the frequency bandwidth of the received signal, there will be no detrimental effect on the later signal processing. Rather, since it is possible to maintain the level of the received signal component high in the input of the ADC 16, it becomes possible to more appropriately treat the received signal concealed by the noise such as thermal noises, in the later signal processing. Accordingly, it is possible to prevent deterioration in the function or performance of the receiver. Specifically, if assuming that the received signal is a spread-spectrum modulated signal, according to the automatic gain control circuit according to the present exemplary embodiment, it becomes possible to assuredly perform reverse diffusion on the received signal even when there is a significant disturbance superimposed on the received signal.

In addition, in the circuit according to the present exemplary embodiment, the frequency selection circuit 18 need not use an analog filter for selecting a frequency, and therefore can realize a more stabled automatic gain control operation since circuit adjustment is not needed. In addition, compared to a case in which an analog filter is used, the circuit size can be decreased.

Figure 2:
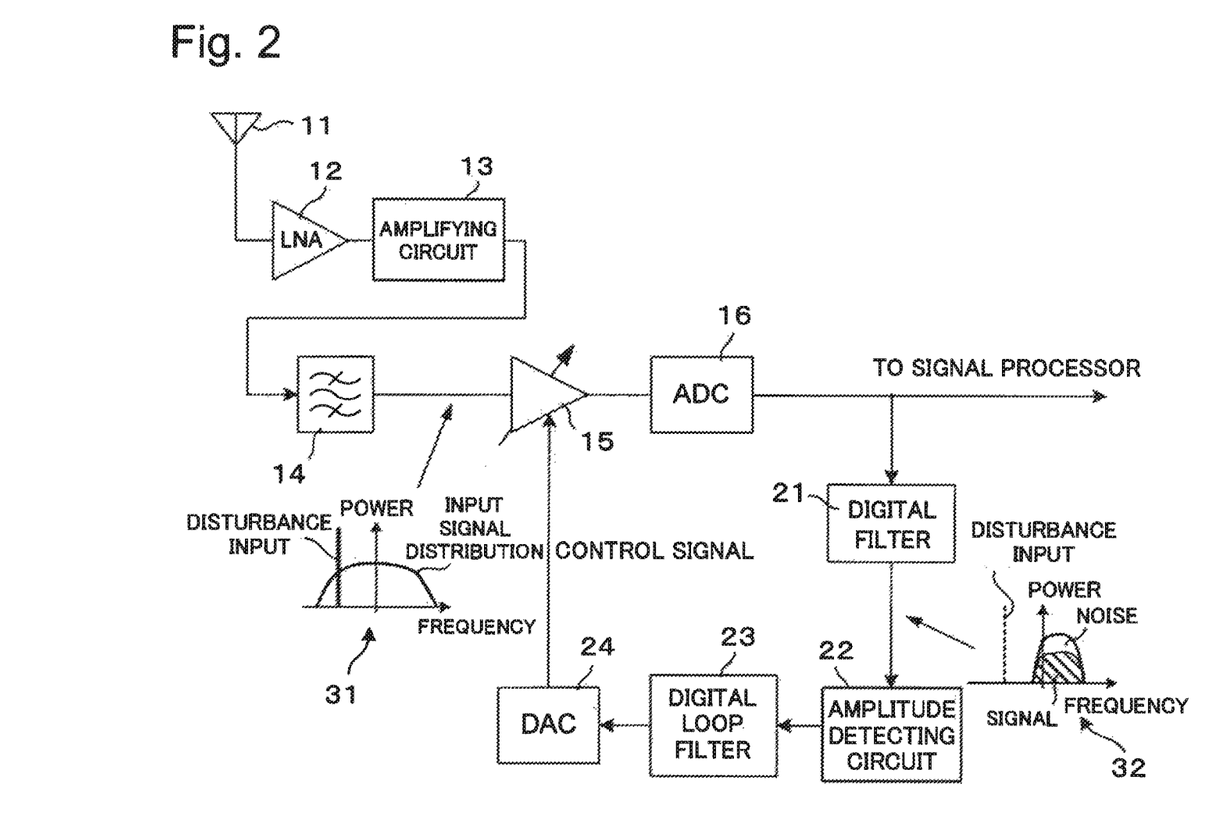
FIG. 2 is a circuitry diagram illustrating a configuration of an RF front-end that includes an automatic gain control circuit according to one exemplary embodiment of the present invention.

Next, another exemplary embodiment of the automatic gain control circuit is explained. FIG. 2 illustrates an example of an RF (radio frequency) front-end that includes an automatic gain control circuit according to one exemplary embodiment of the present invention. The RF front-end illustrated in FIG. 2 includes an automatic gain control function, processes a signal received via the antenna 11, and outputs the resultant signal as a digital signal. Here, the received signal is a direct-spread-spectrum spread modulated signal, for example and a representative of it includes a GPS signal. Just as the RF front-end illustrated in FIG. 6, the RF front-end illustrated in FIG. 2 includes an LNA (low noise amplifier) 12 connected to the antenna 11, and an amplifying circuit 13 provided at the output of the LNA 12. In addition, the RF front-end includes a BPF (band-pass filter) 14 that is provided at the output of the amplifying circuit 13 and causes only a signal of the desired frequency bandwidth to be passed, and a variable gain amplifier 15 to which the output of the BPF 14 is input. Although the amplifying circuit 13 has a function of further amplifying the received signal output by the LNA 12, the amplifying circuit 13 may further include a function and the like of frequency-converting the received signal. When the amplifying circuit 13 has a frequency-converting function, the signal supplied to the BPF 14 will be the received signal after being subject to frequency conversion. The pass band in the BPF 14 is set to correspond to the frequency bandwidth of the received signal. If the received signal is assumed to be a GPS signal, the width of the pass band of the BPF 14 is set to about 5 MHz to 10 MHz, for example.

The signal output by the variable gain amplifier 15, of which the gain changes according to a control signal, is supplied to the ADC (analog-to-digital convertor) 16, thereby being converted into a digital signal. The converted digital signal is supplied to the signal processor of the receiver that includes this RF front-end, for example. As the ADC 16, an ADC of a smaller number of bits such as two bits is used, for example. For generating a control signal, this RF front-end is provided with a digital filter 21 to which a digital signal output from the ADC 16 is input, an amplitude detecting circuit 22 that detects an amplitude of the output signal of the digital filter 21, a digital loop filter 23 to which the output of the amplitude detecting circuit 22 is input, and a DAC (digital-to-analog convertor) 24 that converts the digital signal output by the digital loop filter 23 into an analog signal, and supplies the signal to the variable gain amplifier 15 as a control signal being a voltage signal. The digital filter 21 has a pass band narrower than the pass band of the BPF 14, and the frequency of the pass band of the digital filter 21 is set to a frequency of which the level in the output from the ADC 16 is relatively low, when considering the level for each frequency in the digital signal output by the ADC 16. Alternatively, when there is a disturbance input superimposed on the frequency bandwidth of the received signal, the pass band of the digital filter 21 is set to a bandwidth deviated from the frequency of the disturbance input. Here, the variable gain amplifier 15, the digital filter 21, the amplitude detecting circuit 22, the digital loop filter 23, and the DAC 24 constitute the automatic gain control circuit.

Here, as indicated by the sign 31 in FIG. 2, suppose a case in which a disturbance input having a sharp spectrum is superimposed on a wideband received signal input to the variable gain amplifier 15. Here, a small received signal is assumed, and a component related to the received signal of the signal input to the variable gain amplifier 15 is assumed so that the power with respect to the frequency is distributed in a form approximate to the normal distribution, depending on the pass band characteristic of the BPF 14. The pass band of the digital filter 21 is set to not include the frequency of the disturbance input, thereby making the frequency distribution of the output signal of the digital filter 21 as indicated by the sign 32 in FIG. 2. Here, the distribution is such that a noise not dependent on a frequency such as a thermal noise attributed to the LNA 12 in the former stage is superimposed on the received signal being a desired signal.

As shown by the broken line in the drawing, the output of the digital filter 21 does not include a frequency component of the disturbance input. Therefore, the amplitude detected by the amplitude detecting circuit 22 depends on the amplitude of the original received signal and is not affected by the input from the outside. As a result, the control signal obtained by supplying the output of the amplitude detecting circuit 22 to the DAC 24 through the digital loop filter 23 and converting the output into an analog signal is not affected by the disturbance input, and therefore automatic gain control is to be executed, which does not reflect the magnitude of the disturbance. In the circuit of the present exemplary embodiment, too, the received signal embedded in a noise such as a thermal noise can be more appropriately treated in the later signal processing, just as in the case of the circuit illustrated in FIG. 1. Accordingly, it is possible to prevent the deterioration in the function or performance of the receiver. In particular, when the received signal is a spread-spectrum modulated signal, the reverse diffusion of the received signal can be assuredly performed even under the existence of a significant disturbance superimposed on the received signal. In addition, since not requiring an analog filter for generating a control signal, the circuit illustrated in FIG. 2 has an advantage of making the circuit size smaller.

In the circuit illustrated in FIG. 2, the pass band of the digital filter 21 needs to be set so as to fall outside the frequency of the disturbance input. If the frequency of the disturbance input is known, it is easy to set the digital filter 21. However if the frequency of the disturbance input is unknown or fluctuates, it is inappropriate to use a digital filter 21 having a fixed pass band. In such a case, a digital filter 21 that makes the center frequency of the pass band variable is used, and the amplitude of the output of the digital filter 21 is detected by the amplitude detecting circuit 22, by changing the center frequency. The center frequency that makes the amplitude minimum may be found out, and the pass band of the digital filter 21 may be set depending on that center frequency.

Figure 3:
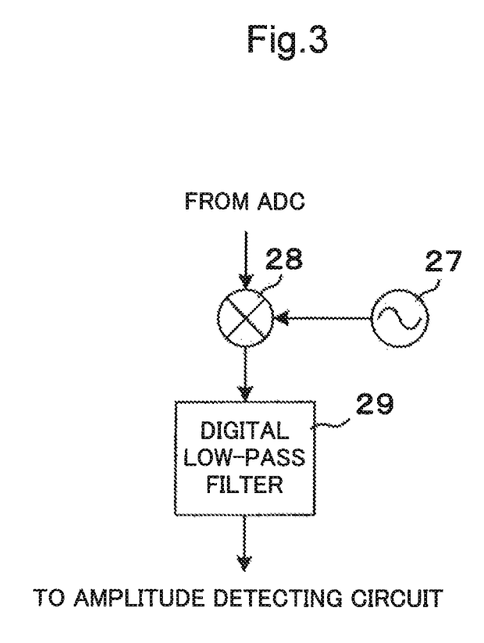
FIG. 3 is a circuitry diagram illustrating an example of a configuration of a variable frequency digital filter.

A digital filter that makes the center frequency of the pass band variable tends to have a complicated circuitry configuration. As a modification example of a variable frequency digital filter that can be used in the present exemplary embodiment, an example illustrated in FIG. 3 may be used. That is, as a variable frequency digital filter, a configuration may be used that is made up of an oscillation waveform generation circuit 27 that generates an oscillation waveform of a variable frequency as a digital signal, a multiplication circuit 28 that multiplies the output from the ADC 16 by the output from the oscillation waveform generation circuit 27, and a digital low-pass filter 29 that receives the output from the multiplication circuit 28. The cutoff frequency of the digital low-pass filter 29 is set to a frequency obtained by converting the width of the pass band as a digital filter 21. The cutoff frequency of the digital low-pass filter 29 may match with the width of the pass band as a digital filter 21. Assuming that the oscillation waveform generated by the oscillation waveform generation circuit 27 is a sine wave, a digital multiplication is performed in this multiplication circuit 28. By making the result supplied to the digital low-pass filter 29, overall, it will function as a digital filter that can decide the center frequency of the pass band by means of the frequency of the waveform generated by the oscillation waveform generation circuit 27. By detecting the amplitude in the amplitude detecting circuit 22 while sweeping the frequency of the waveform generated by the oscillation waveform generation circuit 27, and stopping the frequency sweep at the point of reaching the minimum amplitude, the frequency having the smallest level of signal outputted from the ADC 16 in the frequency bandwidth of the received signal, can be selected.

Figure 4:
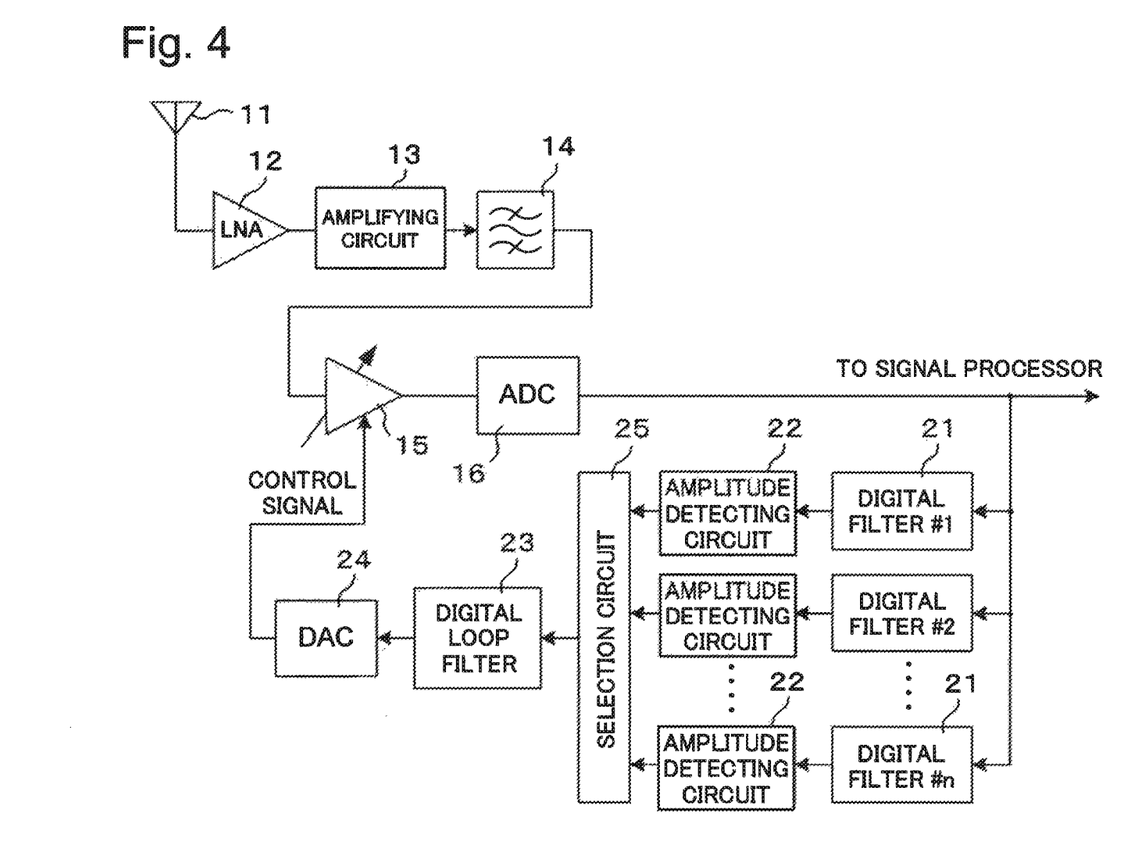
FIG. 4 is a circuitry diagram illustrating a configuration of an RF front-end that includes an automatic gain control circuit according to another exemplary embodiment of the present invention.

In the automatic gain control circuit illustrated in FIG. 2, it is necessary to, every time the frequency of the disturbance input is changed, detect the amplitude of the digital filter 21 and re-set the center frequency of the pass band of the digital filter 21. In view of this, the output of the ADC 16 is supplied in parallel to the plurality of digital filters having different center frequencies, and the amplitude of the output of each of the plurality of digital filters is detected. It is possible to select the output of the digital filter generating the minimum amplitude, and to, based on the amplitude of the selected output, generate a control signal for the variable gain amplifier 15. FIG. 4 illustrates an example of a configuration of an RF front-end including an automatic gain control circuit, which supplies the outputs from the ADC 16 in parallel to the plurality of digital filters.

Just as the RF front-end illustrated in FIG. 2, the RF front-end illustrated in FIG. 4 is provided with an LNA 12, an amplifying circuit 13, a BPF 14, a variable gain amplifier 15, and an ADC 16, and the output from the ADC 16 is supplied to a signal processor provided in the receiver including this RF front-end. In addition, n digital filters 21 that receive the output of the ADC 16 in parallel are provided, assuming that "n" is an integer equal to or greater than 2. The "n" is an integer typically from three to ten. The pass bands of all these n digital filters 21 are narrower than the pass bands of the BPF 14, and their center frequencies are mutually different from one another. The output of each digital filter 21 is connected to the amplitude detecting circuit 22, which detects the output of the corresponding digital filter 21. A selection circuit 25 is provided to receive the amplitude detected at the n amplitude detecting circuit, and the selection circuit 25 selects the minimum amplitude of the input amplitudes while the disturbance is input, and outputs the selected amplitude. Furthermore, the RF front-end is provided with a digital loop filter 23 that receives an output of the selection circuit 25 and a DAC 24 that supplies an output of the digital loop filter 23, after converting it into an analog signal, to the variable gain amplifier 25 as a control signal. The variable gain amplifier 15, the n digital filters 21, the n amplitude detecting circuits 22, the selection circuit 25, the digital loop filter 23, and the DAC 24 constitute the automatic gain control circuit.

Figure 5:
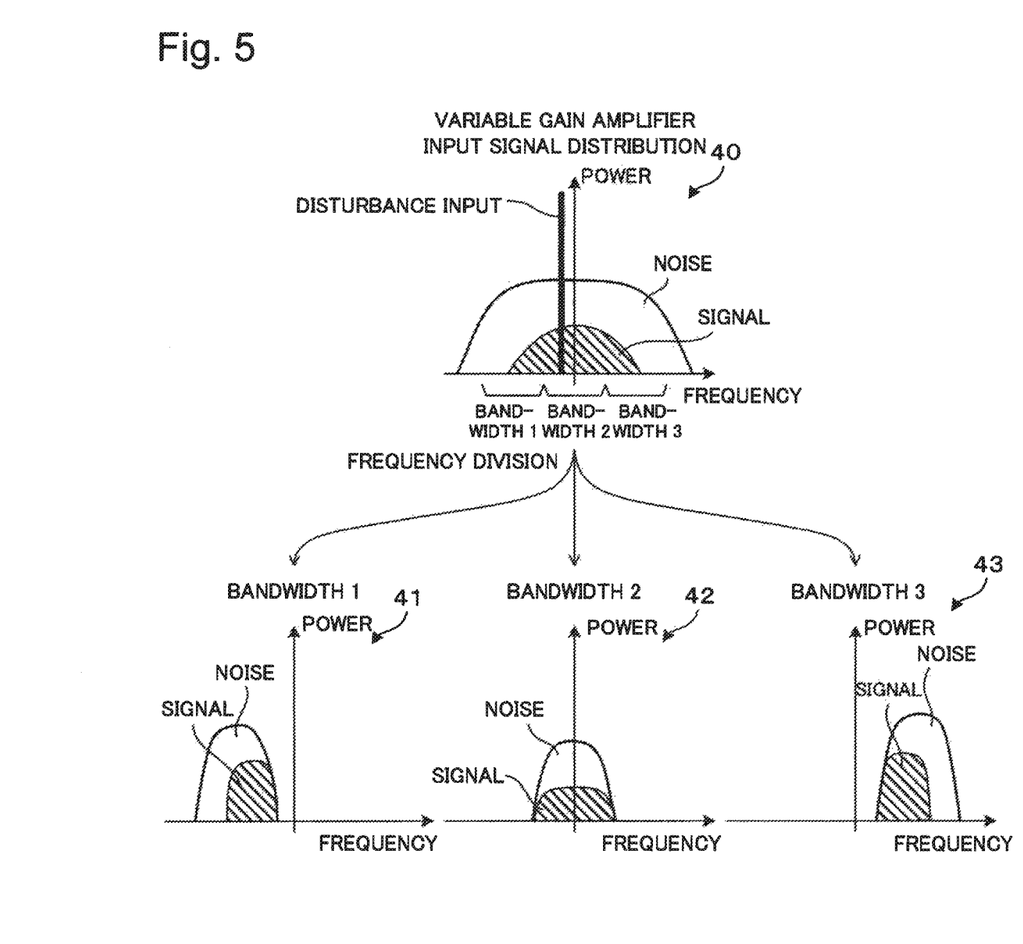
FIG. 5 is a diagram for explaining an operation of the circuit illustrated in FIG. 4.

Next, with reference to FIG. 5, an operation of the automatic gain control circuit in the RF front-end illustrated in FIG. 4 is explained. Here, for the convenience of explanation, it is assumed that n=3, and three digital filters 21 are provided.

Because the center frequencies of the pass bands of the three digital filters 21 are different from one another, the frequency bandwidth of the received signal is divided into three bands of Band 1, Band 2, and Band 3, as illustrated by the sign 40 in the drawing. These three bands respectively correspond to the pass bands of the three digital filters 21. Here, it is assumed that, in the input signal distribution of the variable gain amplifier, a disturbance having a sharp frequency spectrum is input in Band 2. The frequency of the disturbance is located near Band 1 in Band 2. As a result, when detecting the amplitude of the output of each digital filter 21, the magnitude of the amplitudes are: Band 2>Band 1>Band 3.

The sign 41 in FIG. 5 represents, in the case where a control signal for the variable gain amplifier 15 is generated based on the amplitude of the output of the digital filter 21 corresponding to Band 1, a signal distribution of the output of this digital filter 21. Likewise, the sign 42 represents, in the case where a control signal for the variable gain amplifier 15 is generated based on the amplitude of the output of the digital filter 21 corresponding to Band 2, a signal distribution of the output of this digital filter 21. The sign 43 represents, in the case where a control signal for the variable gain amplifier 15 is generated based on the amplitude of the output of the digital filter 21 corresponding to Band 3, a signal distribution of the output of this digital filter 21. When these signal distributions 41 to 43 are compared, the signal distribution 43 corresponding to Band 3 has the largest signal level. This is because Band 3 is least susceptible to the effect of the disturbance input, among Band 1 through Band 3. In contrast, the signal distribution 42 has a very smaller signal level, due to the effect of the disturbance contained in Band 2. Therefore, assume that the automatic gain control is performed based on the amplitude in Band 2. Under that assumption, by being affected by the disturbance, the gain of the variable gain amplifier 15 decreases, to reduce the reception level of the received signal being a desired signal. Note that even if the frequency of the disturbance is in Band 2, Band 1 is also affected by the disturbance because of the frequency characteristic of the filter. It should be careful that the signal distributions 41 to 43 in FIG. 5 have been obtained under different gains in the variable gain amplifier 15.

In view of this, in the examples illustrated in FIG. 4 and FIG. 5, the selection circuit 25 selects the amplitude of the output of the digital filter 21 corresponding to Band 3, supplies the selected amplitude to the digital loop filter 23, and generates a control signal for the variable gain amplifier 15. By generating a control signal in this manner, the automatic gain control free from the effect of the disturbance input can be performed. As a result, it is possible to maintain the signal level of the received signal component high in the signal input to the ADC 16. Accordingly, it is possible to perform the later signal processing more appropriately to prevent deterioration in the function or performance of the receiver. Also in this example, when the frequency of the disturbance input is changed, the digital filter 21 selected by the selection circuit 25 also changes by following the change. This makes it possible to always select the band of which the amplitude is minimum. Therefore, even if there is a change in the frequency of the disturbance input, the automatic gain control is performed always based on a signal of a band, of which the signal revel of the received signal is high without being affected by the disturbance input.

So far, the invention of the present application has been explained by referring to the exemplary embodiments. However, the invention of the present application is not limited to the above exemplary embodiments. The configuration and details of the invention of the present application can be modified in many ways as can be conceived of by those skilled in the art, within the scope of the invention.

This application claims priority of Japanese Patent Application No. 2014-170187 filed on Aug. 25, 2014, all the disclosure of which is incorporated herein.

REFERENCE SIGNS LIST

11 Antenna
12 LNA (low noise amplifier)
13 Amplifying circuit
14 BPF (band-pass filter)
15 Variable gain amplifier
16 ADC (analog-to-digital convertor)
17 Control circuit
18 Frequency selection circuit
19 Control signal generation circuit
21 Digital filter
22 Amplitude detecting circuit
23 Digital loop filter
24 DAC (digital-to-analog convertor)
25 Selection circuit
27 Oscillation waveform generation circuit
28 Multiplication circuit
29 Digital low-pass filter

What is claimed is:

1. An automatic gain control method used in a receiver that includes: a variable gain amplifier to which a received signal is input; and an analog-to-digital convertor connected to an output of the variable gain amplifier, the method comprising:
  selecting a frequency of which a signal level output by the analog-to-digital convertor is smaller than other frequencies in a plurality of frequencies in a frequency bandwidth of the received signal; and
  determining a gain for the variable gain amplifier based on a signal strength of a component of the selected frequency in the output of the analog-to-digital convertor,
  wherein the selecting includes supplying the output of the analog-to-digital convertor to a digital filter having a pass band narrower than the frequency bandwidth, and wherein a center frequency of the digital filter is variable is variable, and the selecting further includes detecting an amplitude of an output of the digital filter by changing the center frequency, and selecting the center frequency that makes the amplitude minimum.

2. An automatic gain control method used in a receiver that includes: a variable gain amplifier to which a received signal is input; and an analog-to-digital convertor connected to an output of the variable gain amplifier, the method comprising:
selecting a frequency of which a signal level output by the analog-to-digital convertor is smaller than other frequencies in a plurality of frequencies in a frequency bandwidth of the received signal; and
determining a gain for the variable gain amplifier based on a signal strength of a component of the selected frequency in the output of the analog-to-digital convertor, wherein
the selecting includes dividing the frequency bandwidth into a plurality of bands, and selecting the band of which the amplitude is minimum by detecting an amplitude of the received signal for each band, and
the determining includes determining the gain for the variable gain amplifier based on the amplitude in the selected band.

3. The method according to claim 2, wherein selecting the band includes:
supplying the output of the analog-to-digital convertor to a plurality of digital filters respectively having a pass band narrower than the frequency bandwidth and having mutually different center frequencies within the frequency bandwidth; and
detecting an amplitude of an output of each of the plurality of digital filters, and
selecting an output of a digital filter that makes the amplitude minimum.

4. An automatic gain control circuit including a variable gain amplifier to which a received signal is input and supplying an output of the variable gain amplifier to an analog-to-digital convertor, the automatic gain control circuit comprising:
a frequency selection circuit that is connected to the output of the analog-to-digital convertor and selects a signal of a bandwidth narrower than the frequency bandwidth, within the frequency bandwidth of the received signal; and
a control signal generation circuit that generates a control signal for the variable gain amplifier based on a strength of a signal selected by the frequency selection circuit,
wherein the frequency selection circuit includes a digital filter that is connected to the output of the analog-to-digital convertor and includes a pass band narrower than the frequency bandwidth,
and wherein a center frequency of the digital filter is variable is variable, and the automatic gain control circuit detects an amplitude of an output of the digital filter by changing the center frequency, and generates the control signal based on the output of the digital filter at the center frequency that makes the amplitude minimum.

5. The automatic gain control circuit according to claim 4, wherein
the digital filter includes:
an oscillation waveform generation circuit that generates an oscillation waveform of a variable frequency, as a digital signal;
a multiplication circuit that multiplies an output of the analog-to-digital convertor by an output of the oscillation waveform generation circuit; and
a digital low-pass filter to which an output of the multiplication circuit is input.

6. An automatic gain control circuit including a variable gain amplifier to which a received signal is input and supplying an output of the variable gain amplifier to an analog-to-digital convertor, the automatic gain control circuit comprising:
a frequency selection circuit that is connected to the output of the analog-to-digital convertor and selects a signal of a bandwidth narrower than the frequency bandwidth, within the frequency bandwidth of the received signal; and
a control signal generation circuit that generates a control signal for the variable gain amplifier based on a strength of a signal selected by the frequency selection circuit, wherein
the control signal generation circuit includes:
an amplitude detecting circuit that detects an amplitude of an output of the digital filter;
a digital loop filter to which an output of the amplitude detecting circuit is input; and
a digital-to-analog convertor that converts an output of the digital loop filter to an analog signal and supplies the analog signal to the variable gain amplifier as the control signal.

7. An automatic gain control circuit including a variable gain amplifier to which a received signal is input and supplying an output of the variable gain amplifier to an analog-to-digital convertor, the automatic gain control circuit comprising:
a frequency selection circuit that is connected to the output of the analog-to-digital convertor and selects a signal of a bandwidth narrower than the frequency bandwidth, within the frequency bandwidth of the received signal; and
a control signal generation circuit that generates a control signal for the variable gain amplifier based on a strength of a signal selected by the frequency selection circuit, wherein
the frequency selection circuit includes:
a plurality of digital filters that respectively include pass bands narrower than the frequency bandwidth and include mutually different center frequencies;
a plurality of amplitude detecting circuits that respectively detect amplitudes of outputs of the plurality of digital filters; and
a selection circuit that detects a minimum amplitude from among the amplitudes detected by the plurality of amplitude detecting circuits, and outputs the minimum amplitude.

8. The automatic gain control circuit according to claim 7, wherein
the control signal generation circuit includes:
a digital loop filter to which an output of the selection circuit is input; and
a digital-to-analog convertor that converts an output of the digital loop filter to an analog signal and supplies the analog signal to the variable gain amplifier as the control signal.

* * * * *